United States Patent
Szu

(10) Patent No.: US 6,697,263 B2
(45) Date of Patent: Feb. 24, 2004

(54) SOCKET HAVING FRAME FOR SUPPORTING THERMAL MODULE

(75) Inventor: Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/266,737

(22) Filed: Oct. 7, 2002

(65) Prior Publication Data

US 2003/0142485 A1 Jul. 31, 2003

(30) Foreign Application Priority Data

Jan. 20, 2002 (TW) .......................................... 91200994

(51) Int. Cl.[7] ................................................ H05K 9/00

(52) U.S. Cl. ........................ 361/816; 361/709; 361/818

(58) Field of Search .................................. 361/704, 707, 361/709, 697, 785, 801, 816, 818; 439/66, 71, 591, 592

(56) References Cited

U.S. PATENT DOCUMENTS

| | | | | |
|---|---|---|---|---|
| 5,199,889 A | * | 4/1993 | McDevitt, Jr. | 439/66 |
| 6,198,630 B1 | * | 3/2001 | Cromwell | 361/704 |
| 6,222,731 B1 | * | 4/2001 | Katsui | 361/697 |
| 6,359,783 B1 | * | 3/2002 | Noble | 361/704 |
| 6,449,157 B1 | * | 9/2002 | Chu | 361/704 |

* cited by examiner

*Primary Examiner*—David Martin
*Assistant Examiner*—Thanh S. Phan
(74) *Attorney, Agent, or Firm*—Wei Te Chung

(57) ABSTRACT

A socket (10) for connecting a CPU (30) to a PCB (50) includes a base (12) and a frame (20) surrounding the base. The base has a plurality of terminals (14) received therein. A receiving space is defined between the base and the frame, for receiving the CPU therein. When the CPU is fittingly received in the receiving space of the socket, the CPU contacts the terminals. When a thermal module (40) is placed in thermal contact with the CPU, the frame supports the thermal module. Thus the frame prevents the thermal module from causing the CPU to press too hard against the terminals.

1 Claim, 5 Drawing Sheets

SOCKET HAVING FRAME FOR SUPPORTING THERMAL MODULE

BACKGROUND OF THE INVENTION

1. Field of the Invention

The present invention relates to sockets for connecting electronic devices to printed circuit boards, and particularly to a socket having a frame for supporting a thermal module which is used for dissipation of heat generated from an electronic device mounted on the socket.

2. Prior Art

Developments in computer chip technology have given central processing units (CPUs) more functions and faster processing speeds. Accordingly, modern CPUs generate copious amounts of heat. Excessive heat can adversely affect operation of the computer system, and cause the system to become unstable. Therefore, a thermal module is widely used to remove heat from a CPU of a computer.

FIGS. 4 and 5 show a conventional electronic device assembly. A thermal module 80 is attached to a CPU 82. The CPU 82 is mounted on a socket 84. The socket 84 is mounted on a printed circuit board (PCB) 86. A back plate 88 is mounted at an underside of the PCB 86. A plurality of through holes (not labeled) is defined in the back plate 88. A plurality of bolts 90 respectively extends through the through holes of the back plate 88, the PCB 86 and the thermal module 80. A plurality of nuts 92 respectively threadedly engages with the bolts 90 and abuts against the thermal module 80, thereby fixing the CPU 82 to the socket 84.

However, during assembly, the nuts 92 are prone to be over-tightened on the bolts 90. The thermal module 80 is pressed too tightly against the CPU 82. This frequently damages the CPU 82 or the socket 84 or both.

SUMMARY OF THE INVENTION

Accordingly, an object of the present invention is to provide a socket having a frame that can support a thermal module and thereby prevent the thermal module from exerting excessive force on a CPU received in the socket.

To achieve the above-mentioned object, a socket for connecting a CPU to a PCB includes a base and a frame surrounding the base. The base has a plurality of terminals received therein. A receiving space is defined between the base and the frame, for receiving the CPU therein. When the CPU is fittingly received in the receiving space of the socket, the CPU contacts the terminals. When a thermal module is placed in thermal contact with the CPU, the frame supports the thermal module. Thus the frame prevents the thermal module from causing the CPU to press too hard against the terminals.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
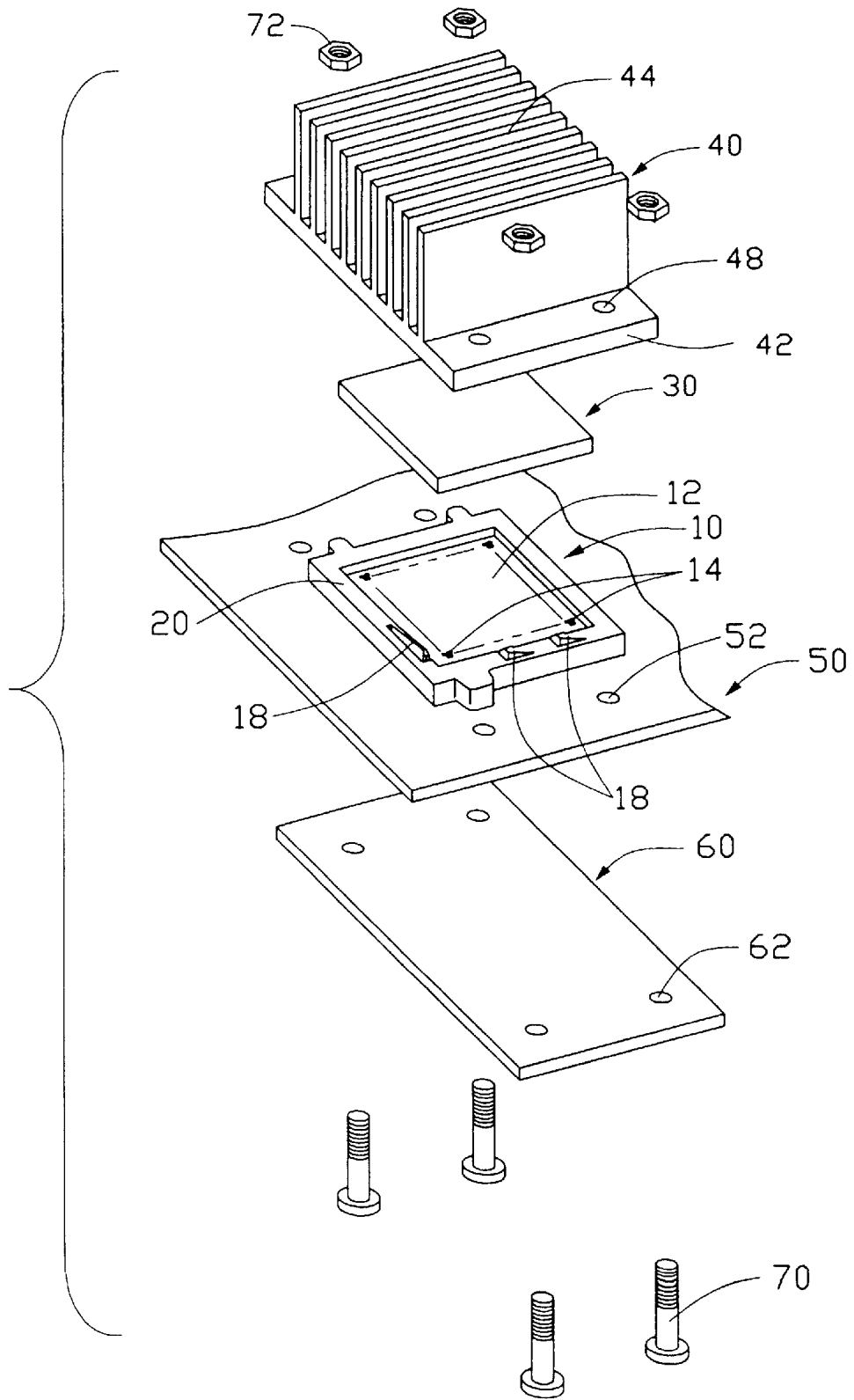
FIG. 1 is an exploded view of an electronic device assembly, including a socket in accordance with the present invention mounted on a PCB, a CPU, a thermal module and a back plate.

Referring to FIG. 1, a socket 10 in accordance with the present invention includes a base 12 receiving a plurality of terminals 14 (only four shown) therein, and a frame 20 surrounding the base 12. The base 12 and the frame 20 cooperatively define a receiving space (not labeled) for receiving a CPU 30 therein. Three spring fingers 18 are formed at two adjacent inner sides of the frame 20, for resiliently engaging with the CPU 30.

The socket 10 is mounted on a PCB 50. Two pairs of through holes 52 are defined in the PCB 50, at opposite sides of the socket 10 respectively. A back plate 60 is for reinforcing and protecting the PCB 50. Two pairs of securing holes 62 are defined in the back plate 60, corresponding to the through holes 52 of the PCB 50. A thermal module 40 includes a conducting body 42, and a plurality of dissipation fins 44 extending upwardly from the conducting body 42. Two pairs of fixing holes 48 are defined in the conducting body 42, corresponding to the through holes 52 of the PCB 50. Four bolts 70 and four nuts 72 are used for assembling the aforementioned components together.

Figure 2:
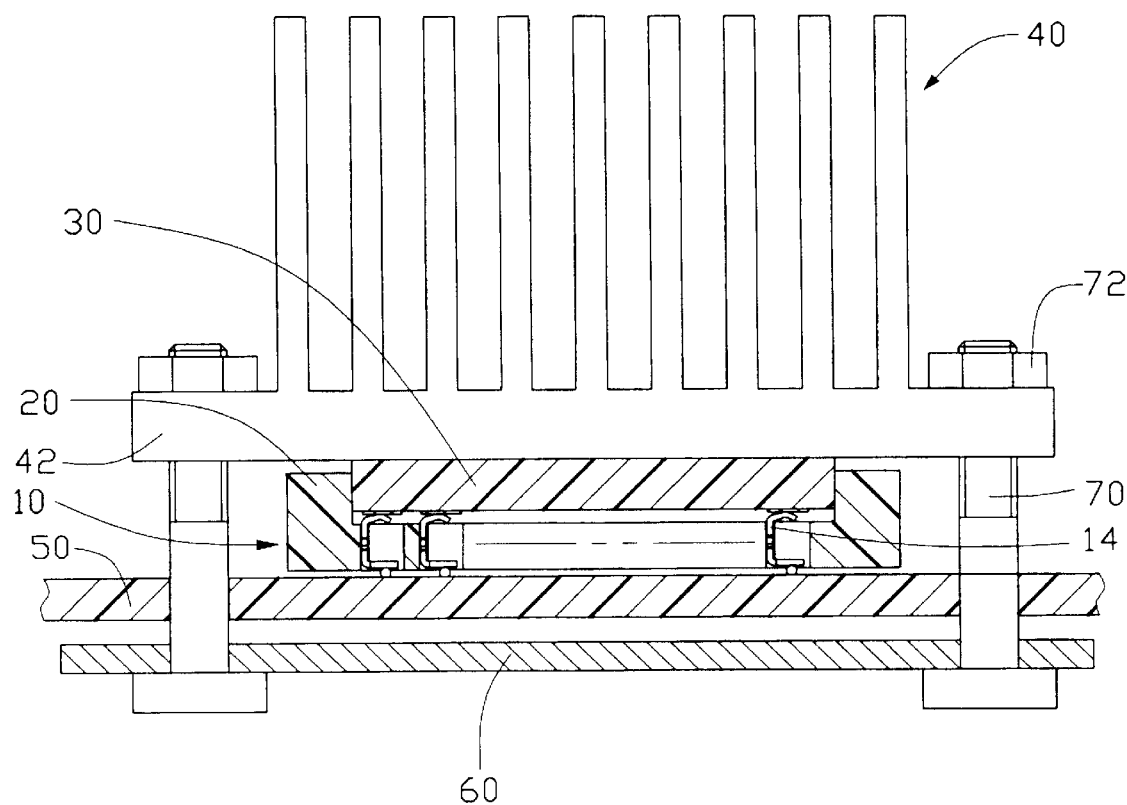
FIG. 2 is a partial cross-sectional view of the electronic device assembly of FIG. 1 fully assembled, showing the thermal module contacting the CPU.
Figure 3:
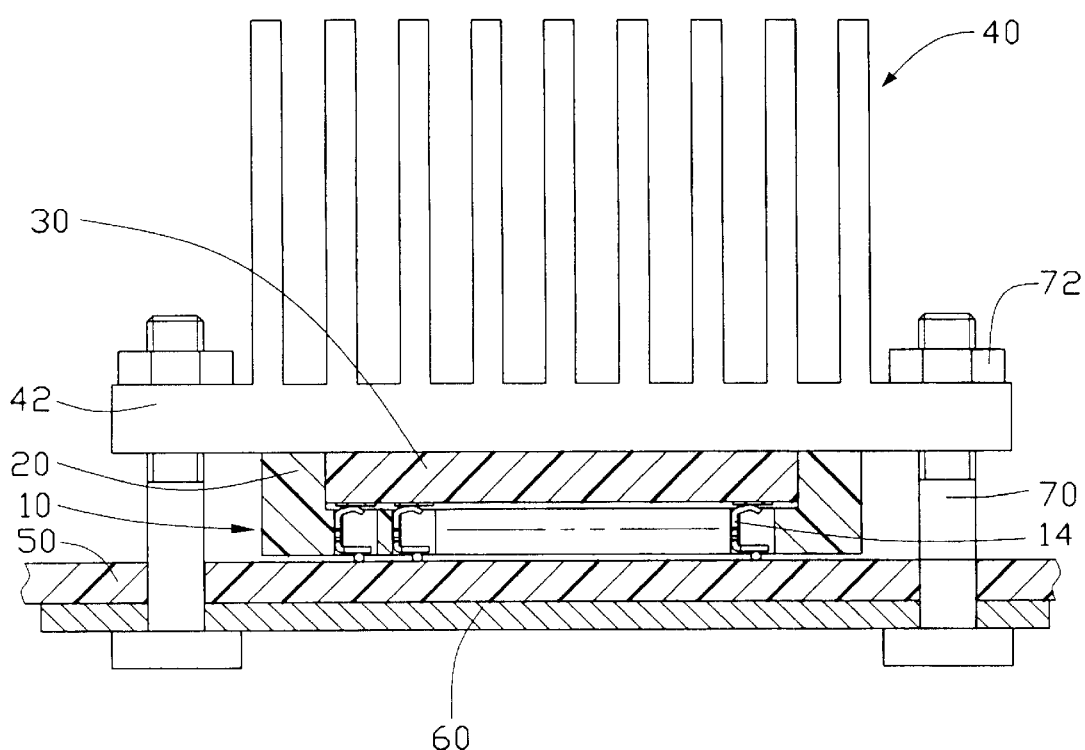
FIG. 3 is similar to FIG. 2, but showing the thermal module pressing on the CPU and fixing the CPU to the socket.
Figure 4:
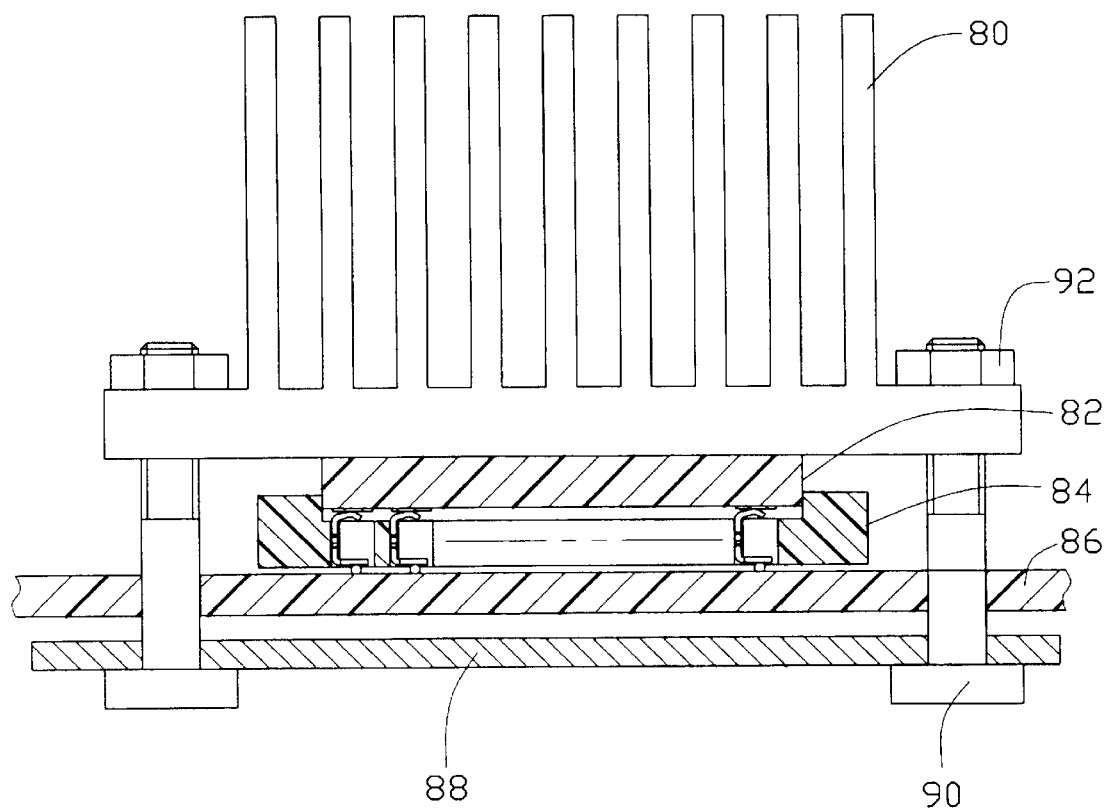
FIG. 4 is a partial cross-sectional view of a conventional electronic device assembly, including a socket mounted on a PCB, a CPU mounted on the socket, a thermal module contacting the CPU, and a back plate mounted at an underside of the PCB.
Figure 5:
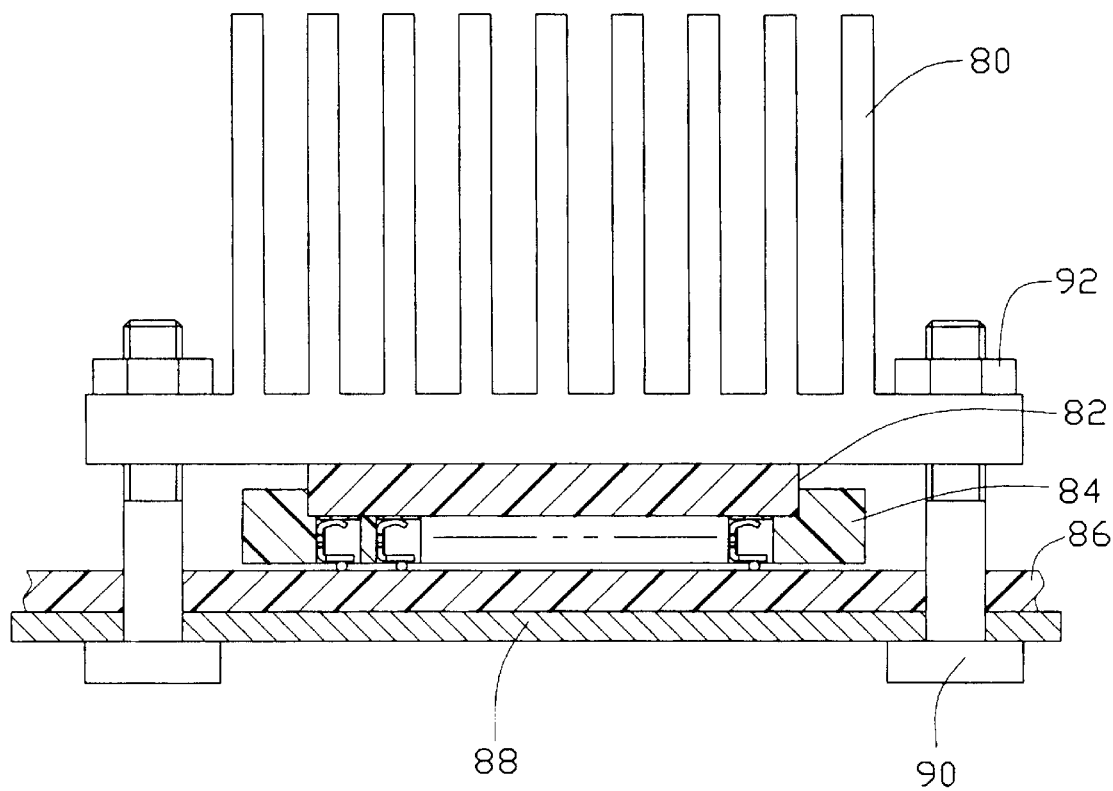
FIG. 5 is similar to FIG. 4, but showing the thermal module pressing on the CPU and fixing the CPU to the socket.

Referring to FIGS. 2 and 3, in assembly, the CPU 30 is fittingly received in the receiving space of the socket 10. The CPU 30 loosely contacts the terminals 14 of the socket 10. The conducting body 42 of the thermal module 40 is placed in thermal contact with the CPU 30. The bolts 70 are respectively extended through the securing holes 62 of the back plate 60, the through holes 52 of the PCB 50 and the fixing holes 48 of the thermal module 40, and respectively threadedly engaged with the nuts 72. The thermal module 40, the CPU 30, the socket 10, the PCB 50 and the back plate 60 are thereby fixed together. The CPU 30 resiliently and firmly contacts the terminals 14. The frame 20 of the socket 10 contacts and supports the conducting body 42 of the thermal module 40. The frame 20 accordingly prevents the nuts 72 from being over-engaged with the bolts 70. Thus the frame 20 prevents the conducting body 42 from causing the CPU 30 to press too hard against the terminals 14.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An electronic device assembly comprising:
   a printed circuit board;
   a socket mounted on the printed circuit board, the socket comprising a base and a frame surrounding the base, the base receiving a plurality of terminals therein, the base and the frame cooperatively defining a receiving space;
   an electronic device received in the receiving space of the socket, the electronic device defining a top face located above a top surface of the frame in a vertical direction when said electronic device is, at a free stage, upwardly supported in said vertical direction by thereunder the terminals which are in a relaxed manner; and a thermal module disposed upon and in thermal and physical contact with the electronic device thereunder, and spaced from the top surface of the frame with a distance when said electronic device is at said free stage; wherein a fastening device fastens the printed circuit board and the thermal module together in said vertical direction and imposes a vertical force upon the thermal module to press downwardly against the electronic device at an engagement stage thus having the terminals in a compressed manner, under a condition that the thermal module is additionally supported in said vertical direction by the frame instead of by the electronic device only, and wherein a height of the electronic device is smaller than that of the receiving space, so that the terminals in the compressed manner still extend upwardly above a top surface of the base and urge the electronic device in thermal contact with the thermal module.

* * * * *